United States Patent
Bong et al.

(10) Patent No.: US 9,512,278 B2
(45) Date of Patent: Dec. 6, 2016

(54) LOCK-RELEASE POLYMERIZATION

(75) Inventors: Ki Wan Bong, Cambridge, MA (US); Patrick Seamus Doyle, Boston, MA (US); Daniel Colin Pregibon, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 1478 days.

(21) Appl. No.: 13/125,306

(22) PCT Filed: Oct. 21, 2009

(86) PCT No.: PCT/US2009/061474
§ 371 (c)(1),
(2), (4) Date: Feb. 17, 2012

(87) PCT Pub. No.: WO2010/048279
PCT Pub. Date: Apr. 29, 2010

(65) Prior Publication Data
US 2012/0135235 A1    May 31, 2012

Related U.S. Application Data

(60) Provisional application No. 61/196,901, filed on Oct. 21, 2008.

(51) Int. Cl.
*G03F 7/20* (2006.01)
*C08J 3/075* (2006.01)
*G03F 7/00* (2006.01)

(52) U.S. Cl.
CPC .............. *C08J 3/075* (2013.01); *G03F 7/0037* (2013.01); *G03F 7/2012* (2013.01); *G03F 7/2035* (2013.01); *Y10T 428/2982* (2015.01)

(58) Field of Classification Search
CPC ....... C08J 3/075; G03F 7/2012; G03F 7/2035; G03F 7/0037; B81C 2201/0159
See application file for complete search history.

(56) References Cited

U.S. PATENT DOCUMENTS

| | | | |
|---|---|---|---|
| 6,488,872 | B1 | 12/2002 | Beebe et al. |
| 2002/0056945 | A1 | 5/2002 | Gelbart |
| 2003/0045597 | A1 | 3/2003 | Randolph et al. |

(Continued)

FOREIGN PATENT DOCUMENTS

| | | | |
|---|---|---|---|
| GB | 2388652 A | | 11/2003 |
| WO | WO2010048279 A2 | | 4/2010 |

OTHER PUBLICATIONS

Ciba, "Photoinitiators for UV Curing, Key Products Selection Guide", "Ciba Specialty Chemicals", , pp. 1-8.

(Continued)

*Primary Examiner* — Yogendra Gupta
*Assistant Examiner* — Ninh Le
(74) *Attorney, Agent, or Firm* — Eugene J. Molinelli; Beusse Wolter Sanks & Maire

(57) ABSTRACT

Techniques are provided to independently control 3D shape and chemistry of rapidly produced colloids. A pre-polymer mixture including a monomer is made to flow into a channel with insular relief in a wall at a known location of the channel. A stimulus that polymerizes the pre-polymer mixture is directed onto the known location to form a structure locked in place at the known location by the insular relief. A pressure is applied to the channel that is sufficient to deflect the wall having the insular relief sufficiently to release a hydrogel particle comprising the structure.

7 Claims, 9 Drawing Sheets

(56) References Cited

U.S. PATENT DOCUMENTS

2005/0043428 A1    2/2005   Caneba
2006/0228386 A1   10/2006   Stephens et al.
2007/0054119 A1    3/2007   Garstecki et al.
2007/0105972 A1    5/2007   Doyle et al.

OTHER PUBLICATIONS

Hillborg et al., "Crosslinked polydimethylsiloxane exposed to oxygen plasma studied by neutron reflectometry and other surface specific techniques", "Polymer", 2000, pp. 6851-6863, vol. 41.

ISA/KR, "International Search Report and Written Opinion for Corresponding PCT application No. PCT/US2009/061474", May 28, 2010, pp. 1-11.

Jo et al., "Three-Dimensional Micro-Channel Fabrication in Polydimethylsiloxane (PDMS) Elastomer", "Journal of Microelectromechanical Systems", Mar. 2000, pp. 76-81, vol. 9, No. 1.

Kenis et al., "Microfabrication Inside Capillaries Using Multiphase Laminar Flow Patterning", "Science", Jul. 2, 1999, pp. 83-85, vol. 285.

Perro et al., "Design and synthesis of Janus micro- and nanoparticles", "Journal of Materials Chemistry", 2005, pp. 3745-3760, vol. 15.

Shiku et al., "Oxygen Permeability of Surface-modified Poly(dimethylsiloxane) Characterized by Scanning Electrochemical Microscopy", "Chemistry Letters", 2006, pp. 234-235, vol. 35, No. 2.

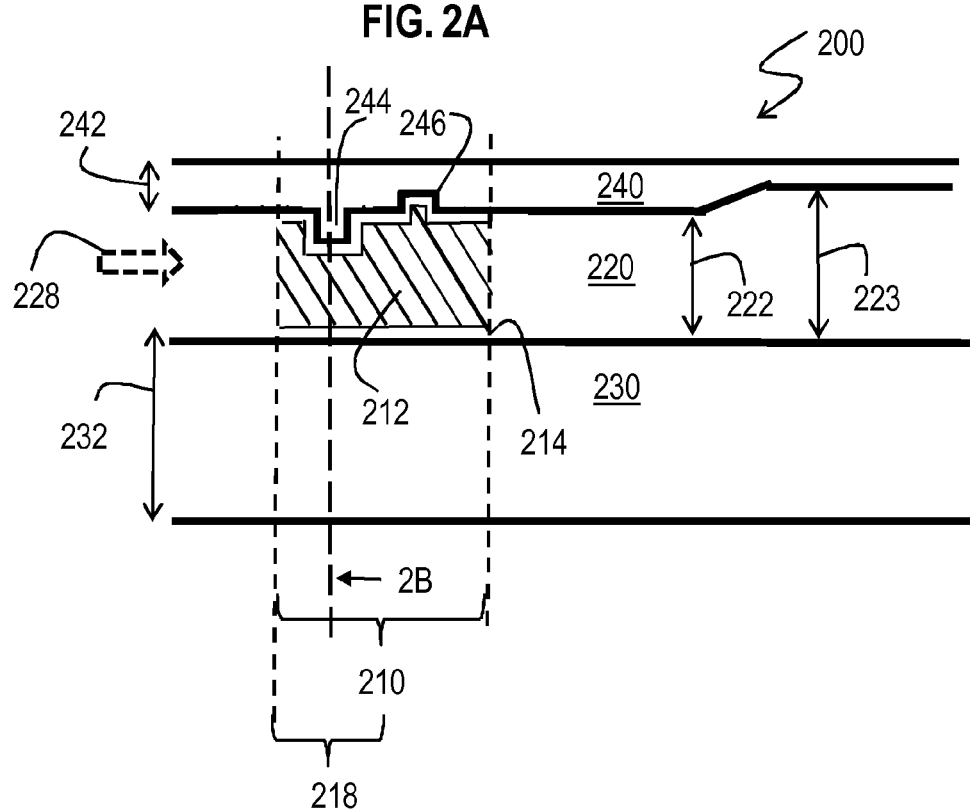
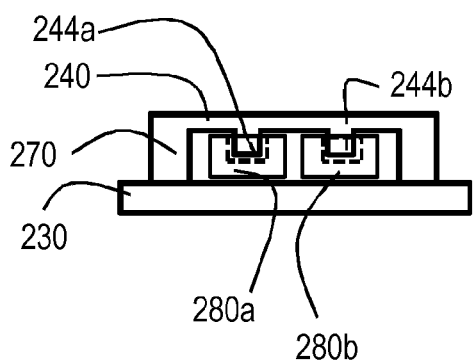
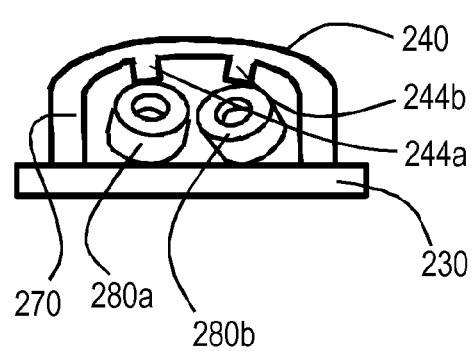

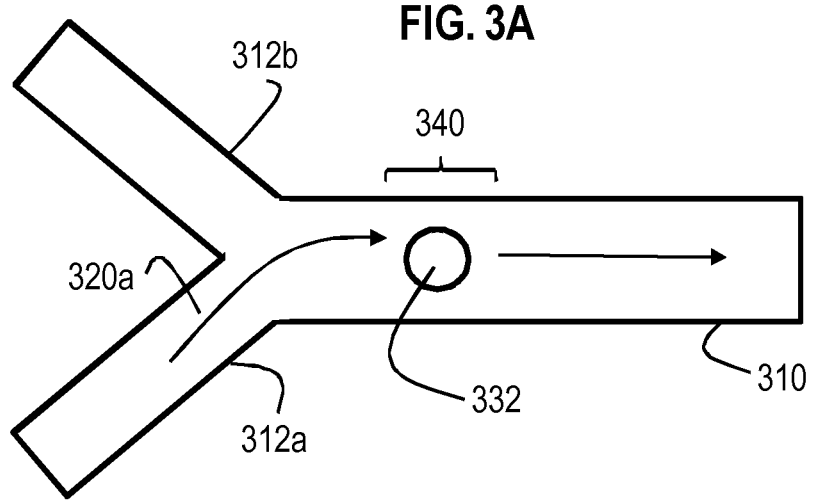
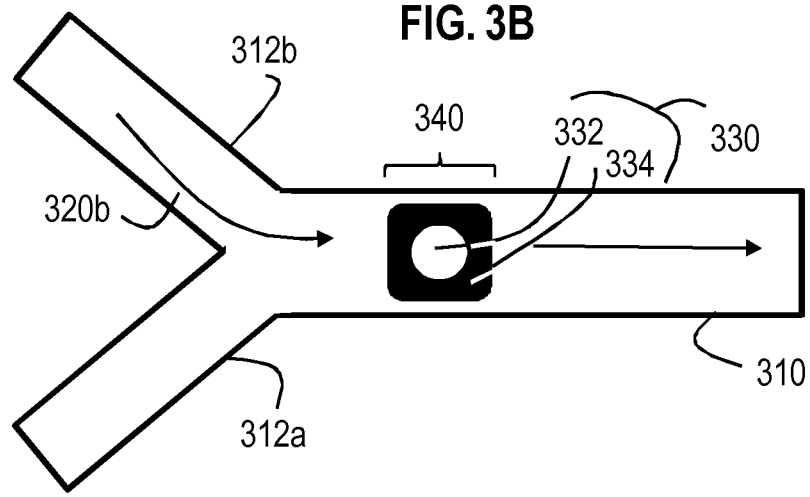
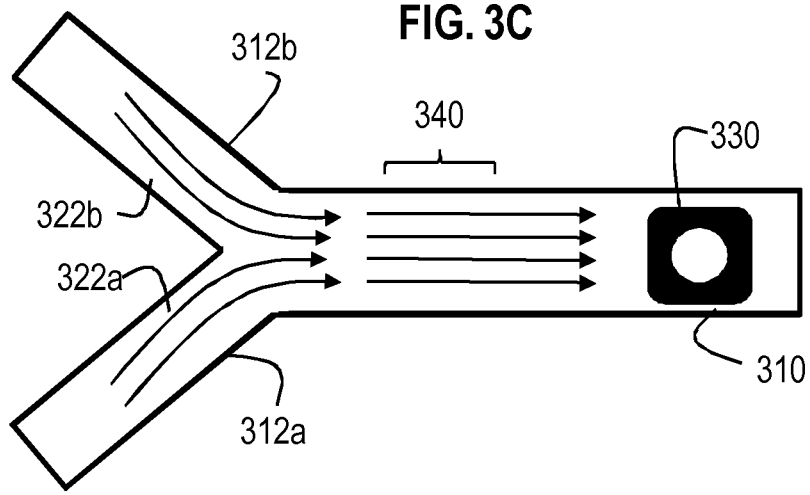

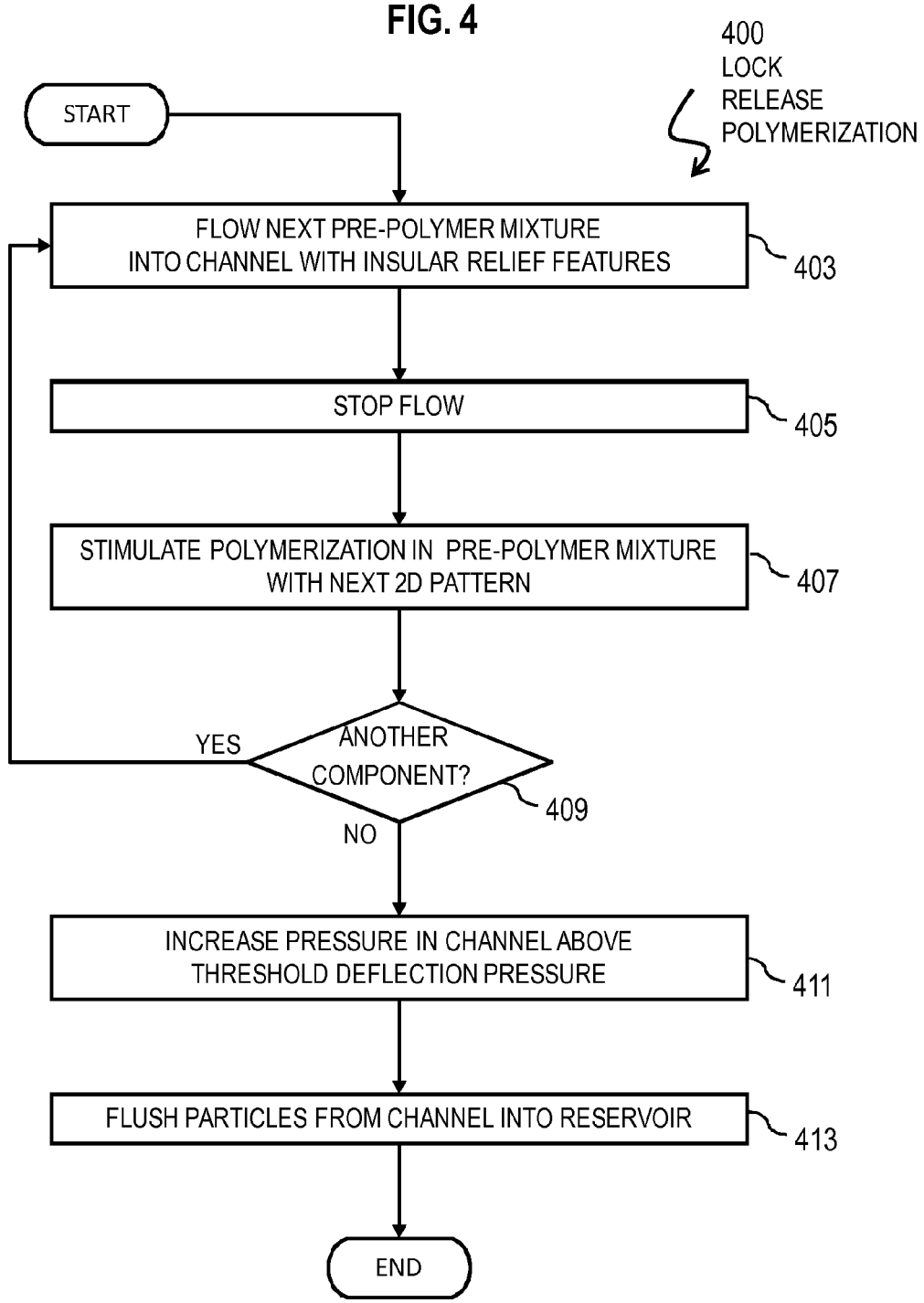

LOCK-RELEASE POLYMERIZATION

CROSS-REFERENCE TO RELATED APPLICATIONS

This application claims benefit of Provisional Appln. 61/196,901, filed Oct. 21, 2008, the entire contents of which are hereby incorporated by reference as if fully set forth herein, under 35 U.S.C. §119(e).

This application is related to U.S. utility application Ser. No. 11/867,217 filed Oct. 4, 2007 and published as US Patent Application Publication US 2008/0176216 on Jul. 24, 2008 (hereinafter Doyle I), the entire contents of which are hereby incorporated by reference as if fully set forth herein.

This application is related to U.S. utility application Ser. No. 11/586,197 filed Oct. 25, 2006 and published as US Patent Application Publication US 2007/0105972 on May 10, 2007 (hereinafter Doyle II), the entire contents of which are hereby incorporated by reference as if fully set forth herein.

STATEMENT OF GOVERNMENTAL INTEREST

This invention was made with Government support under Contract No. CTS-0304128 awarded by the National Science Foundation. The Government has certain rights in the invention.

BACKGROUND

Spherical colloidal particles are ubiquitous in drug delivery, in vivo and in vitro diagnostics, as well as additives in almost every industry (food, cosmetics, paints, etc). The ability of these particles to accurately interact with biological organisms, cells or molecules in a complex mixture or in vivo is useful in both basic research and clinical settings. The vast majority of particles used in suspension arrays are optically encoded latex microspheres with diameters between 0.3 and 10 microns (1 micron=$10^{-6}$ meters) that can be interrogated and decoded with laser-based flow cytometry (measurement of cell sized particles). Optical encoding is accomplished by swelling the spheres with fluorescent organic dyes with different emission spectra. While recent advances in the field of colloid synthesis have produced anisotropic (non-spherical) particles, the ability to rapidly control three dimensional (3D) size and shape and chemistry independently, has not been demonstrated.

EXAMPLE EMBODIMENTS

Applicants have recognized a need to independently control 3D shape and chemistry of rapidly produced colloids. Techniques are provided to rapidly produce and use non-spherical colloidal particles with independently controlled 3D shape and size, and chemical properties.

In one set of embodiments, a method for synthesizing hydrogel particles includes flowing a pre-polymer mixture including a monomer into a channel with insular relief in a wall at a known location of the channel. A stimulus that polymerizes the pre-polymer mixture is directed onto the known location to form a structure locked in place at the known location by the insular relief. A pressure is applied to the channel that is sufficient to deflect the wall having the insular relief sufficiently to release a hydrogel particle comprising the structure.

As used herein, insular relief refers to variations in topography of channel wall, which are not both 1) aligned with direction of flow of structures through a channel and 2) uniform in height over a region in the channel where the structure is polymerized.

In another set of embodiments, an apparatus for synthesizing hydrogel particles comprises a body structure having formed therein a channel with insular relief in a wall of the channel at a known location along the channel. A wall at the known location deflects sufficiently at applied pressures above a threshold pressure to release a hydrogel particle polymerized at the known location.

In another set of embodiments, a hydrogel microparticle has an arbitrary 2D shape and relief in a third dimension, and includes multiple non-parallel patterned chemistries.

In another set of embodiments, a hydrogel microparticle has an arbitrary 2D shape and relief in a third dimension, comprising a first portion of the 2D shape and a different second portion of the 2D shape, wherein the first portion swells in response to a range of pH values and the second portion does not swell in response to the range of pH values.

Still other aspects, features, and advantages are readily apparent from the following detailed description, simply by illustrating a number of particular embodiments and implementations, including the best mode contemplated for carrying out the invention. The invention is also capable of other and different embodiments, and its several details can be modified in various obvious respects, all without departing from the spirit and scope of the invention. Accordingly, the drawings and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which:

FIG. 2A is a block diagram that illustrates an elevation view of a channel of a microfluidic device and microstructure polymerized therein, according to an embodiment;

FIG. 2B is a block diagram that illustrates a cross-sectional view of a channel of a microfluidic device and two microstructures locked therein, according to an embodiment;

FIG. 2C is a block diagram that illustrates a cross-sectional view of a deformed channel of a microfluidic device and two microstructures released therefrom, according to an embodiment;

FIG. 3A, FIG. 3B and FIG. 3C are block diagrams that illustrate formation of a hydrogel particle with multiple non-parallel patterned chemistries, according to an embodiment;

FIG. 4 is a flowchart that illustrates a method to produce and use 3D hydrogel particles, including microparticles with multiple non-parallel patterned chemistries, according to an embodiment;

DETAILED DESCRIPTION

Figure 1A:
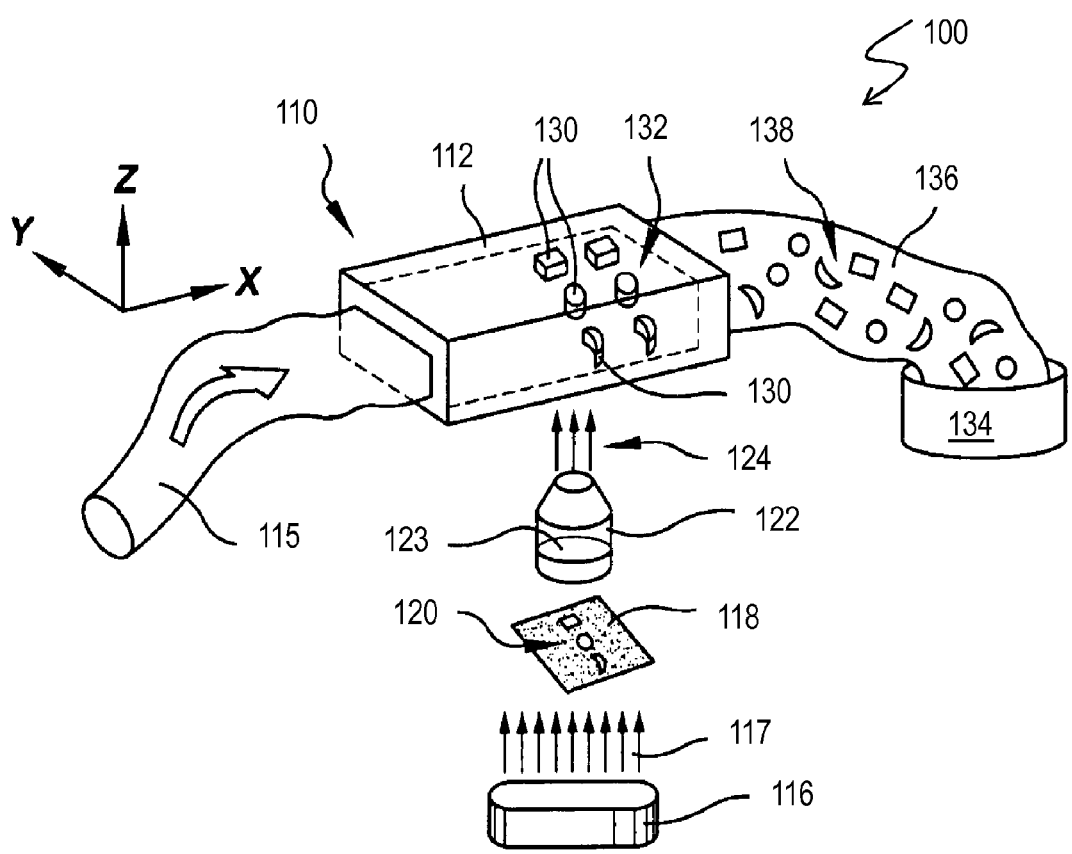
FIG. 1A is a block diagram that illustrates a system for producing 3D hydrogel microparticles, according to an embodiment.

A method and apparatus are described for producing and using hydrogel particles with independently controlled 3D size and shape and chemistry. In the following description, for the purposes of explanation, numerous specific details are set forth in order to provide a thorough understanding. It will be apparent, however, to one skilled in the art that some embodiments may be practiced without these specific details. In other instances, well-known structures and devices are shown in block diagram form in order to avoid unnecessarily obscuring the illustrated embodiments.

Some embodiments are described below in the context of producing and using microparticles having at least one dimension no greater than 500 micrometers (μm, also called microns, 1 μm=$10^{-6}$ meters) with different fluorophores. However, the invention is not limited to this context. In other embodiments, the apparatus is used to produce larger particles or microparticles with different chemistries to detect or quantify or deliver substances to targets or add properties to articles of manufacture such as paints, cosmetics, food and medicine. Example targets include one or more of biological entities such as proteins, nucleic acids, cytokines, lipids, organelles, whole cells, enzymes, antibodies, pathogens such as bacteria, viruses and toxins including those that could be used as bio-terror threats, or any range of chemicals from polymers to small molecules.

As used herein a microparticle is a particle with at least one dimension in a range from about 0.1 micrometers (μm, also called microns, 1 μm=$10^{-6}$ meters) to about 500 microns. The dimensions of a particle size are characterized by a length greater than a width greater than a thickness. A hydrogel (also called aquagel) is a network of polymer chains that are water-insoluble. A polymer is a large molecule (macromolecule) composed of repeating structural units (called monomers) typically connected by covalent chemical bonds. Hydrogels are highly absorbent (they can contain over 99% water) and possess a degree of flexibility due to their significant water content.

Three dimensional (3D) and composite particles have potential uses for distinct advantages as sorting media, smart materials and building blocks for self-assembled structures with complex functionality, impacting fields in drug delivery, composition manufacture, tissue engineering, optics and electro-mechanics. Several methods for the preparation of 3D particles have been reported in previous researches. Some examples are multiphoton fabrication (Kawata et al., *Nature*, v412, p 697, 2001; and Lafratta et al., *Angew. Chern. Int.* Ed. 46, p 6238, 2007), off-wafer fabrication (Tao et al., *Nat. Protocols*, v1, p 3153, 2006) and the PRINT method (Rolland et al., *J. Am. Chern. Soc.*, v127, p 10096, 2005). However, such current methodologies cannot synthesize 3D and composite particles on a large scale. Also, they suffer from constraints of morphology and functionality.

For example, multiphoton fabrication is a well-known method for synthesizing micro-scale ($10^{-6}$ meters) or nano-scale ($10^{-9}$ meters) 3D structures. Multiphoton fabrication provides unparalleled control of morphology in all dimensions. In spite of the advantage, this direct drawing technique is prohibitively time-consuming. To partially overcome this, it has been used to generate master molds for a soft-molding process. Then particles are fabricated in the molds by injecting a soft material. However, this method has not been used to generate multifunctional particles.

For higher throughput, 3D particles can be generated using a layer-by-layer process with photo resists, well known for fabricating solid state electronic circuitry and microfluidic devices. Unfortunately, the use of photo-resists is not ideal for many applications; the chemistries are extremely restricted, and the chemical patterning is limited to parallel layered motifs. Alternatively, 3D particles can be generated using the PRINT method, where particles are shaped using a 3D mold. However, the shapes of such molds are limited, and the process is not suitable for the synthesis of particles with different active chemical properties on different parts of the particle (called herein multiple patterned chemistries). There exist several other synthesis techniques that suffer from similar constraints on morphology and chemical functionality.

In some of the embodiments described below, a method called "Lock Release Lithography" (LRL) allows for the high-throughput production of particles with complex 3D morphologies and composite particles with configurable chemistries, including multiple patterned chemistries. LRL utilizes a combination of channel topology, mask design, and pressure-induced channel deformation to form and release particles in a cycled fashion. Compared with previous techniques, LRL provides a much simpler means to synthesize patterned particles and also gives unprecedented control over 3D morphology, functionality, and composition. As shown in more detail below, LRL can be used to rapidly generate various 3D and complex, composite particles with a broad range of potential chemistries, interwoven or excluded, with incorporated entities including nucleic acids, proteins, living cells, quantum dots, beads and nanoparticles. Among other uses, this technology may provide a powerful means to mass-produce functional units for microfluidic operations, filtration systems, and tissue engineering constructs. In some embodiments, lock and release operations are performed with other stimulations that polymerize one or more monomers, such as thermal stimulation. For example, potassium persulfate can be used as a thermal free radical initiator.

LRL builds on "Stop Flow Lithography" (SFL), described in Doyle I and Doyle II. SFL provides hydrogel particles and hydrogel microparticles with arbitrary 2D shapes and sizes and multiple patterned chemistries where the patterns are parallel, i.e., the borders between regions of different chemistry are parallel. LRL enables non-parallel patterned chemistries as well as 3D shapes.

System

FIG. 1A is a block diagram that illustrates a system for producing 3D hydrogel microparticles, according to an embodiment. Using the technique of SFL, as described in Doyle II, a pre-polymer mixture 115 including one or more types of monomers and polymerization initiation ingredients, e.g., a photo-initiation ingredient that promotes polymerization upon exposure to light, is input to a microfluidic device 112. SFL consists of three steps in which the flow of a pre-polymer mixture, such as a liquid phase oligomer solution, is stopped, polymerized, and then restarted to flush out the polymerized particles.

According to some embodiments, the microfluidic device 112 includes a channel with one or more positive or negative insular relief features that lock a polymerized particle, and any precursor structures, into place. As used herein insular relief refers to variations in topography of one or more channel walls, which are not both 1) aligned with direction of flow of structures through a channel and 2) uniform in height over a region in the channel where the structure is polymerized. Examples of insular relief features are bumps and pits of any cross section on a wall of the channel. Examples of wall topographies that are not insular relief are rails in a channel wall aligned in direction of flow and constant in height, at least in a region in the channel where the structure is polymerized. When the particle is completed, the channel is deformed, preferably elastically, by increasing the pressure in the channel, until the particle is released from the relief features. Then an induced flow flushes out the polymerized particles. In some embodiments, the deformation exceeds an elastic limit and the channel ruptures, releasing the particles.

The system 100 includes a microfluidic device 112 having a selected hollow cross-sectional geometry forming a channel with at least one dimension less than 500 μm. The example microfluidic device 112 exhibits a rectangular cross section channel but a wide range of other cross section channel geometries can be employed in other embodiments. In some example embodiments, the microfluidic device channel width is characterized by an inner channel width of, e.g., between about 100 nanometers (nm, 1 nm=$10^{-9}$ meters) and about 1 millimeter (mm, 1 mm=$10^{-3}$ meters), with channel walls having a thickness of, e.g., between about 10 μm and 10 mm, and with a channel length of, e.g., between about 1 mm and 100 mm. The microfluidic device 112 is configured to accept a stream of a pre-polymer mixture 115 that is directed to the channel of the microfluidic device for passage through the device. The microfluidic device 112 is formed of any suitable material. In the example arrangement of FIG. 1A the microfluidic device is constructed of, e.g., polydimethylsiloxane (PDMS) or other suitable material. It is advantageous for the material to be oxygen permeable to form a oxygenated layer, as described in more detail below. Therefore, in some embodiments, the microfluidic device is formed of another suitable oxygen-permeable material, such as Mylar, polyurethane, polyethelene, polychlorophene, mercapto ester-based resins, available, for example, as Norland 60, from NORLAND OPTICAL PRODUCTS, INC.™ of New Brunswick, N.J., and porous TYGON™ tubing from SAINT-GOBAIN PERFORMANCE PLASTICS™ of Mickleton, N.J.

The pre-polymer mixture 115 can include a range of constituents. In an illustrated embodiment, at least one of the constituents is provided as a liquid-phase monomer that can be polymerized by photo-polymerization. In the example system of FIG. 1A the pre-polymer mixture includes a photo-polymerizable monomer and a photosensitive initiator species (also called a photo-initialization ingredient). One example of a suitable photo-polymerizable monomer is poly(ethylene glycol) diacrylate, having a molecular weight in a range between about 50 and about 10000 (called PEG DA herein), with 2-hydroxy-2-methyl-1-phenyl-propan-1-one employed as the photosensitive initiator species. Other suitable polymerizable monomers include 1,1,1-tri(m ethyl propane triacrylate), 1,6-hexanediol diacrylate, and poly (ethylene glycol) dimethacrylate, among others. Other suitable photoinitiators include DMPA or IRGACURE 184 (1-Hydroxy-cyclohexyl-phenyl-ketone), from CIBA SPECIALTY CHEMICALS™ of Tarrytown, N.Y., among others. The monomer stream can also include other selected monomers such as PEG to increase porosity, as well as particles, beads, molecules, porogens, and other species to impart desired chemical and physical properties to the particles. The monomer stream 115 advantageously includes one or more liquid-phase components that enable passage of the stream through the channel of microfluidic device 112.

At one or more portions along the microfluidic device is provided stimulation for enabling the formation and polymerization of particles in the monomer stream. For the example of FIG. 1A in which the monomer stream includes a photo-polymerizable monomer PEGDA, at one or more selected points along the length of the microfluidic device 112 there is provided a source 116 of illumination 117 that is directed toward the microfluidic device 112. The walls of the microfluidic device are preferably substantially transparent to the wavelength of the illumination 117. Visible light, ultraviolet (UV) light, infrared (IR) light, or other wavelength of light can be employed as suited for a selected monomer species. For PEGDA, UV illumination is a suitable polymerizing stimulation.

The polymerizing stimulation is shaped in two dimensions in correspondence with desired particle 2D shapes. The formed particle thereby takes on the shape of the polymerizing stimulation. For example, interposed between the illumination source and the microfluidic device is provided one or more lithographic masks or other lithographic system for shaping the illumination. In the example of FIG. 1, there is provided a dark field lithographic mask 118 including one or more 2D shapes 120 desired for particles to be synthesized. As shown in FIG. 1 the mask can include a plurality of distinct 2D shapes or can include a number of replications of a single 2D shape. For polymerization thermal stimulation sources, the shape of the particle takes on the shape of the polymerizing thermal stimulation, which is often more diffuse and less precise than that provided by the shaped lithographic masks.

In the illustrated embodiment using light to photo polymerize at least one monomer of the pre-polymer mixture, a lens system 122 is interposed between the lithographic mask and the microfluidic device if desired for controlling magnification, focus, or other aspect of the illumination 117 directed through the mask. The illumination exits the lens system and is directed to the microfluidic device. In accordance with various embodiments, the illumination is temporally controlled to provide pulses of illumination of a selected duration. A shutter 123 or other mechanism for controlling the duration of illumination is advantageously provided in a suitable configuration with the lens system 122 and illumination source 116. The duration of each illumination pulse is set based on the flow rate of the stream, the polymerizing characteristics of the monomers in the stream, and the desired 2D shape and thickness of a particle. The flow rate of the monomer stream is also controlled, and can be stopped, in coordination with the temporal control of the illumination. The illumination pulses can be provided as a sequence of pulses, each of a selected duration, or as a single long-duration pulse, as prescribed for a given application.

Exposing a pre-polymer mixture in channels of microfluidic device 112 to a pulse of the shaped illumination 124 polymerizes mask-defined 2D shaped microstructure particles 130 (also called microstructures or polymerized microstructures or polymerized particles or hydrogel particles) directly in the stream of the pre-polymer mixture. The illumination exposure simultaneously defines the shapes of polymeric particles and polymerizes the shaped particles. This dual lithography and polymerization action occurs in the continuous phase of the stream; that is, the one or more liquid-phase constituents in the stream operate as a continuous phase of the stream and are themselves polymerized in some embodiments. Thus the polymerized particles resulting from the dual lithography-polymerization action include polymeric material from the continuous phase of the monomer laden stream in such embodiments.

As stated above, flow of the stream can be controlled in a coordinated manner with the illumination exposure to, in turn, control characteristics of the polymerization. The flow rate and exposure duration are preferably together selected such that there is sufficient dwell time of a given volume of the monomer stream at the site of illumination exposure for substantially full polymerization of mask-defined shaped particles in the stream through the full thickness of the channel. If desired, the stream flow can be substantially stopped in coordination with illumination pulse exposure. A high synthesis through-put, e.g., 100 particles per second and greater, can be achieved. The rate can be enhanced further with the inclusion of multiple illumination points along the length of the microfluidic device, in the manner described above, or by increasing the illumination area and the corresponding number of microstructure shapes projected to the increased area, or some combination.

According to embodiments of a LRL method that modifies SFL, the polymerized particle, or a polymerized precursor structure that is incorporated in the resultant particle, is both shaped in a third dimension and locked in place by the positive or negative insular relief on one or more walls of the channel in the device 112. A polymerized structure remains in place, even if the fluid flows past the structure, until the pressure in the channel is increased to deflect the walls of the channel sufficiently to release the structure by disengaging the features of the insular relief on the walls from the structure, as described in more detail below. The released structure, which may be the composite of several polymerization steps, as described in more detail below, is the particle 130 produced by LRL.

Once the particles 130 are released, the particles 130 advect through un-polymerized monomer stream or other liquid phase through the microfluidic device. A set 132 of such particles are schematically shown in FIG. 1 downstream of the lithography-polymerization point. The volume of un-polymerized liquid phase constituents remaining in the stream after the one or more lithography-polymerization steps operates to conduct the particles through and out of the microfluidic device 112. A reservoir 134 is provided for collecting the output stream 136, which includes a population 138 of particles. As can be recognized, if only one transparent mask shape is employed, then the particle population is homogeneous, and preferably is mono-disperse.

The synthesized particles are rinsed in the reservoir or, e.g., taken by pipette into another container for rinsing. For example, the stream including the particle population is taken by pipette from the reservoir into an eppendorf tube, suspended in a buffer with a surfactant to prohibit agglomeration, and centrifuged to retrieve the particles from the stream. The particle population can then be employed for a selected application.

Figure 1B:
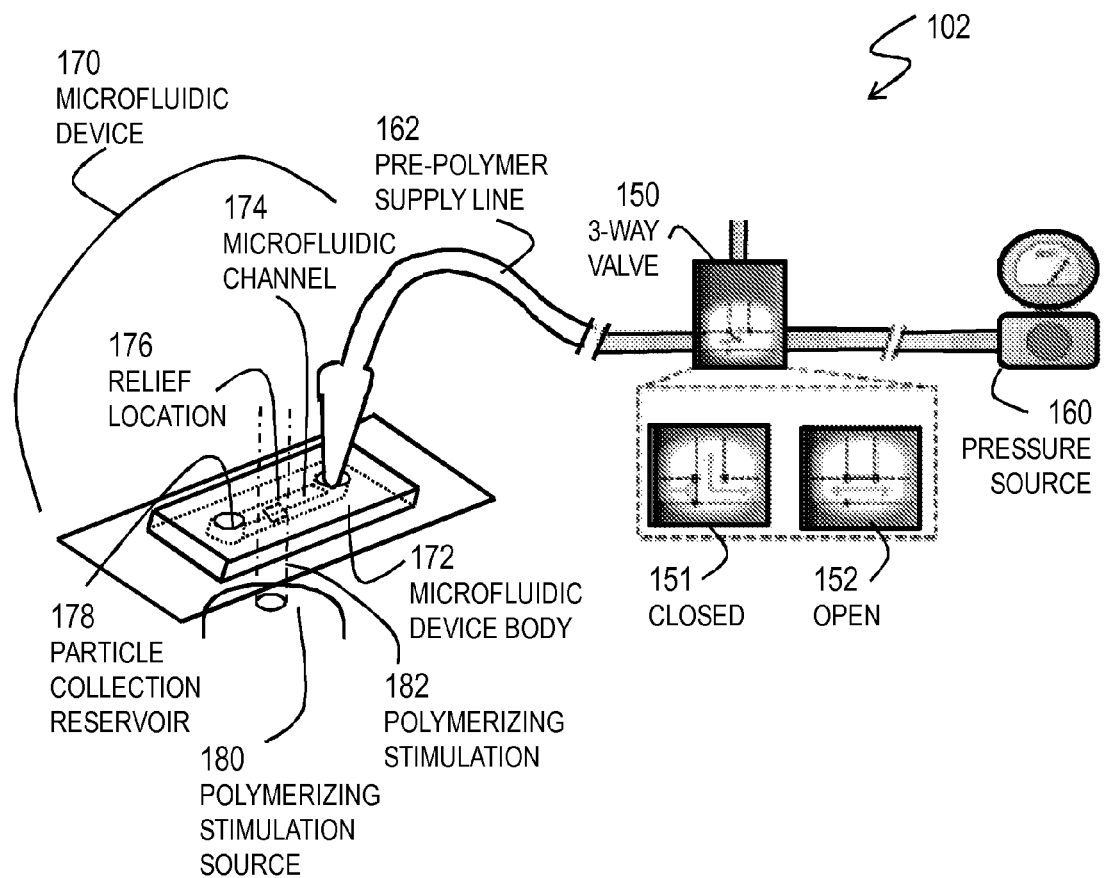
FIG. 1B is a block diagram that illustrates a system for producing 3D hydrogel particles, according to another embodiment.

FIG. 1B is a block diagram that illustrates a system 102 for producing 3D hydrogel particles, according to another embodiment. The system 102 includes a three-way valve 150, a pressure source 160, a pre-polymer mixture supply line 162, a microfluidic device 170 and a polymerizing stimulation source 180 for projecting polymerizing stimulation 182 into the device 170. When the three-way valve is configured as a closed valve, depicted in inset 151, pre-polymer mixture is exchanged with the pressure source 160, and the fluid pressure in device 170 is ambient, e.g., atmospheric. When the three-way valve is configured as an opened valve, depicted in inset 152, pre-polymer mixture is forced under a set pressure through the pre-polymer supply line 162 into the microfluidic device. In some embodiments, the operation of three-way valve 150 and pressure source 160 is automatically controlled, e.g., by a computer system.

Apparatus

The microfluidic device 170 includes a microfluidic device body 172 in which is formed a microfluidic channel 174 which is connected to a particle collection reservoir 178. At a relief location 176 along the channel 174 one or more walls each include one or more insular relief features, collectively called insular relief. Each insular relief feature is either positive (extending from the wall into the flow through the channel, such as a bump or peg), or negative (receding deeper into the wall away from the flow through the channel, such as a pit). The polymerizing stimulation 182 (e.g., 2D shaped illumination 124) from the polymerizing source 180 (e.g., illumination source 116, mask 120 and lens system 122) also impinges into the channel 174 at or near the relief location 176. The portion of the microfluidic body 172 between the relief location 176 of the channel 174 and the nearest point outside the microfluidic device body 172 constitutes the walls of the channel 174 at the relief location 176.

In an example embodiment, the microfluidic device body 172 is made of poly-(dimethylsiloxane) (PDMS). The channel 174 has positive relief features in the topography (e.g., posts protruding from the channel ceiling) at the relief location to lock in an array of particles that are formed by 75 milliseconds (ms, 1 ms=10-3 seconds) of UV exposure through a transparency mask using a standard fluorescence microscope. The 3D particle morphology is defined by a combination of the mask 2D shape features and the channel topography at the relief location. Locked onto the insular relief features, particles remain immobilized until a relatively high pressure (e.g., about 5 pounds per square inch, psi, 1 psi=6894.75 Newtons per square meter, also called a Pascal, Pa) is applied. The high pressure is applied to initiate the flow of the fluid phases and deflect the channel walls beyond the point of particle release. Any pressure can be used that causes the particles to disengage from the insular relief can be used. Using the automated valve system 150, the flow is then stopped via pressure release, and the process is repeated; thus allowing the formation of 3D particles in an automated, semicontinuous manner. For more details about the automated valve system 150, see D. Dendukuri, S. S. Gu, D. C. Pregibon, T. A. Hatton and P. S. Doyle, Lab Chip, v7, pp 818-828, 2007, the entire contents of which are hereby incorporated by reference as if fully set forth herein, except for terms defined to be inconsistent with the terms expressly defined herein. The ratio of pre-polymer mixture which is converted into particles to that which is used to flush out the channel between polymerization cycles can vary from about 1:3 to about 1:50. In one embodiment, the ratio is approximately 1:50.

An aspect of LRL is obtaining sufficient channel deformation to deflect the relief features outward enough to disengage the polymerized structures from the insular relief features and release the structure back into the flow. It is advantageous to produce elastic deformations so that the channel can be reused. For thin-walled PDMS channels, the deformation is determined by classical elasticity theory, given by Equation 1

$$\Delta h\max \approx 0.142 P W^{-4}/(Et^3) \quad (1)$$

where h is channel height, Δhmax is maximum change in channel height, P is the pressure, W is the width of the channel, E is the Young's modulus of PDMS, and t is channel ceiling wall thickness. In agreement with theory, it was observed that particles with 20 micron tall locking structures were released at 5 psi in a 500 micron wide channel, which had a PDMS ceiling (top wall) thickness around 200 microns. For 1 mm wide channels, the equation reveals that 5 psi pressure could provide enough deflection to release 3D particles with relief features of heights up to about 250 microns. To exploit maximum channel deformation and ensure safe particle release, particles were polymerized near the channel inlet, where pressure P is greatest, channels widths were several times larger than the particle widths, and the height of the channel region near the outlet, downstream of the relief location was designed to be taller than the particles. In SFL and LRL, an oxygen lubrication layer of about 1 micron is maintained near channel surfaces to prevent adherence to the channel walls during polymerization and to reduce friction that slows flow through the channel.

FIG. 2A is a block diagram that illustrates an along channel elevation view 200 of a channel of a microfluidic device and microstructure polymerized therein, according to an embodiment. The channel 220 has a height 222 at the relief location and a greater height 223 downstream. The direction of flow is given by dashed arrow 228. The channel 220 has a bottom wall (called a floor) 230 of thickness 232 and a top wall (called a ceiling) 240 of thickness 242 at the relief location. Although the terms bottom and top are used for purposes of illustration, there is no requirement that the channel be oriented in a particular way with respect to the gravitational field where the device is operated. The insular relief in the relief region of the ceiling includes a positive relief feature 244 and a negative relief feature 246.

At or near the relief location, polymerizing stimulation 210 polymerizes a structure 212 that engages both the positive relief feature 244 and the negative relief feature 246. The structure is separated from contact with the walls of the channel 220 by an oxygen lubrication layer 214. In other embodiments, a different polymerizing stimulation 218 is used that engages only the positive relief feature 244. A direction of a cross-section view depicted in FIG. 2B is so indicated for particles polymerized by polymerizing stimulation 218.

FIG. 2B is a block diagram that illustrates a cross-sectional view of a channel of a microfluidic device and two microstructures locked therein, according to an embodiment. Depicted is the channel floor 230, ceiling 240 and side walls 270 as well as two side by side positive relief features 244a and 244b, respectively, collectively called pegs 244 herein. Engaged on the pegs 244 are two polymerized structures 280a, 280b, each with a microcavity caused by the pegs 244. FIG. 2C is a block diagram that illustrates a cross-sectional view of a deformed channel of a microfluidic device and two microstructures that have been released from the insular relief, according to an embodiment. Floor 230 and side walls 270 are as depicted in FIG. 2B. In contrast to FIG. 2B, the channel ceiling 240 in FIG. 2C is deformed enough to deflect the pegs 244 enough that they disengage from the structures 280, which are allowed to advect with the flow of a liquid phase in the channel. In some embodiments, the deflection is at least about 100 microns at pressures above about 5 pounds per square inch. In some embodiments, the deflection is at least about 250 microns at pressures above about 5 pounds per square inch. The released structures 280 are called particles herein.

The relief features are called insular relief or insular relief features to distinguish them from rails used in some lithography embodiments, such as those described in S. E. Chung, W. Park, S. Shin, S. A. Lee and S. Kwon, Nat. Mater., v7, pp 581-587, 2008 (hereinafter Chung). Such rails do not prevent the polymerized structures from sliding along the channel in response to small pressures used to propel pre-polymer mixtures through the channel, and thus such rails fail to lock the structures in place at the relief location. Recall that insular relief refers to variations in topography of channel wall, which are not both 1) aligned with direction of flow of structures through a channel and 2) uniform in height over a region in the channel where the structure is polymerized. This definition excludes rails used in Chung.

Figure 2D:
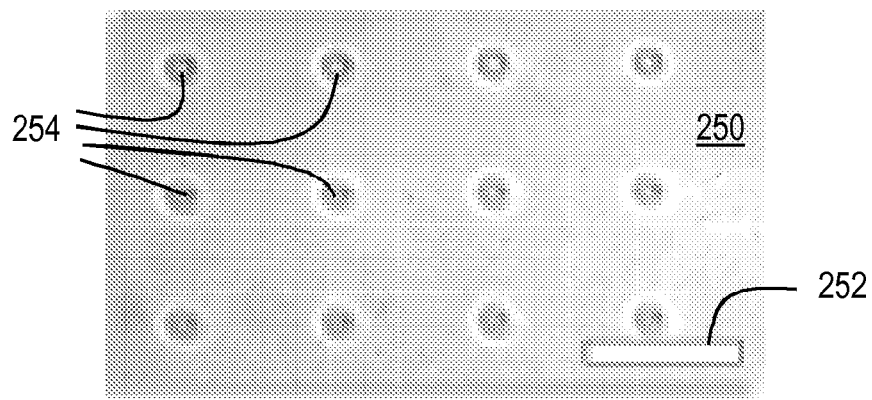
FIG. 2D is a micrograph image that illustrates insular relief on a ceiling of a channel of a microfluidic device, according to an embodiment.
Figure 2E:
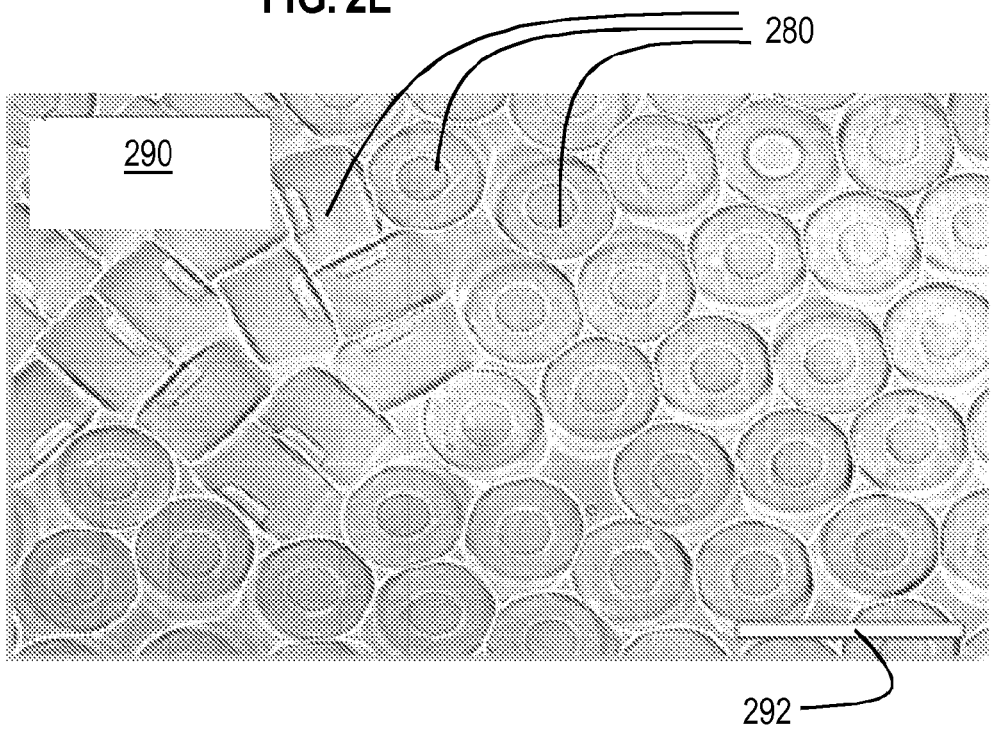
FIG. 2E is a micrograph image that illustrates hydrogel microparticles with 3D shape, according to an embodiment.

FIG. 2D is a micrograph image that illustrates insular relief on a ceiling of a channel of a microfluidic device, according to an embodiment. Shown is a differential interference contrast (DIC) image 250 with a scale bar 252 that represents 100 microns. Twelve individual insular positive features of cylindrical shape (pegs) 254 are depicted protruding from a ceiling of a channel. This ceiling is able to polymerize multiple microparticles 280, each with a microcavity. FIG. 2E is a micrograph image 290 that illustrates hydrogel microparticles with 3D shape, according to an embodiment. Shown is a DIC image of a collection in the channel reservoir of 3D particles 280, each with a microcavity. Scale bar 292 represents 100 microns.

Particles can be arbitrarily large; but minimum particle sizes are limited to be no smaller than a few microns using the illustrated embodiments. Minimum particle and feature size resolutions are dictated in part by the polymerizing stimulation, of which lithography provides the finest resolution. Minimum particle and feature size resolution are further limited by the ability to replicate features from the channel walls. The typical optical resolution achieved in the experimental embodiments described herein was about one micron. Replicating 3D features on a channel wall is limited by the oxygen inhibition layer which is also about one micron thick in the current experiments. Smaller inhibition layers, and hence smaller replicated features, can be achieved by controlling the ambient oxygen concentration. Topographical channel features used in the illustrated embodiments were at least a few microns in size, larger than the UV wavelength (about 360 nm), such that optical interference could be disregarded.

Method

FIG. 3A, FIG. 3B and FIG. 3C are block diagrams that illustrate formation of a hydrogel particle with multiple non-parallel patterned chemistries, according to an embodiment. These figures all show a plan view of a microfluidic channel 310 with a relief location 340 subject to differently shaped polymerizing stimulation, e.g., UV illumination passing through different shaped opaque masks. Two different pre-polymer mixtures are introduced, at corresponding different times—one pre-polymer mixture through inlet channel 312a, and a different pre-polymer mixture through inlet channel 312b, collectively called herein inlet channels 312. In other embodiments, more inlet channels are included or two or more different pre-polymer mixtures use the same inlet channel 312.

At a first time, depicted in FIG. 3A, after a first pre-polymer mixture 320a has flowed into channel 310 from inlet channel 312*a* (as indicted by a flow arrow) and the flow has stopped (e.g., by closing valve 150), a disk structure 332 is polymerized by the shaped polymerizing stimulation (e.g., a first circular photo-mask). The disk structure is locked in place in the location 340 by insular relief (e.g., pegs on the floor or ceiling of channel 310, not shown).

Taking advantage of the locked structure, supplemental structures can be attached to the structure already formed in some embodiments. For example, at a second time, depicted in FIG. 3B, after a different second pre-polymer mixture 320*b*, with different chemistry, has flowed into channel 310 from inlet channel 312*b* (as indicted by a flow arrow) and the flow has stopped (e.g., by closing valve 150), a hollow square structure 334 is polymerized by different shaped polymerizing stimulation (e.g., a hollow square photo-mask). The first structure and supplemental structure are covalently linked if there is some overlap of the two shaped polymerizing stimulations, forming a composite particle 330. If there is no overlap of polymerizing stimulation, there can be effective mechanical linking in some embodiments, if the two shapes interlock, e.g., using a lock and key motif. When covalently or mechanically linked, the insular relief engaged with the locked structure is sufficient, in some embodiments, to hold the composite structure even if there is no additional relief to engage the supplemental structure. The composite structure is locked in place in the location 340 by insular relief (e.g., pegs on the floor or ceiling of channel 310, not shown) over the locked structure and, optionally, over the second structure. Thus, supplemental structure with chemistry 1 is covalently linked to chemistry 2 through mask overlap and UV exposure after fluidic exchange at low pressure. Note that the composite particle need not have a pattern of parallel chemistries. That is, the patterned chemistries can be non-parallel.

When the composite particle is completed with all desired supplemental structures, the pressure is increased to release the particle and flush it into the particle collection reservoir. For example, the composite particles are released by high pressure in both flows. FIG. 3B depicts high pressure in both flows 322*a* and 322*b*, indicated by flow arrows from each inlet channel 312*a* and 312*b*, respectively. The composite particle 330, released when the walls of channel 310 deflect sufficiently under the increased pressure, flows down the channel toward a particle collection reservoir. In some embodiments, the flows 322*a* and 322*b* include the same pre-polymer mixtures as 320*a* and 320*b*, respectively. In some embodiments, either or both are different from those corresponding pre-polymer mixtures and the same or different from each other.

FIG. 4 is a flowchart that illustrates a method 400 to produce and use 3D hydrogel particles, including microparticles with multiple non-parallel patterned chemistries, according to an embodiment. Although steps are shown as separate blocks in a particular order for purposes of illustration, in other embodiments, one or more steps may be performed in a different order, or overlapping in time, in series or in parallel, or one or more steps or portions thereof may be omitted, or one or more additional steps may be added, or more general steps may be substituted for one or more of the particular steps depicted.

In step 403, the next pre-polymer mixture is made to flow into a channel with one or more insular relief features. If there is no previous pre-polymer mixture, the next pre-polymer mixture is an initial pre-polymer mixture to be used at the earliest time. Any pre-polymer mixture may be made to flow into the channel. For example, liquid phase oligomer solution, or any pre-polymer mixture that includes ingredients that impart independently selected chemical properties, or detectability, or mechanical properties such as flexibility and beads and beams, or electrical properties such as conductivity, or magnetic properties, or some combination, is made to flow into the channel with insular relief. In several illustrated embodiments, the pre-polymer mixture includes monomers based on poly(ethylene glycol), as this material is bio-friendly, highly tunable, and can be functionalized with a variety of biomolecules, for example by including acrylic acid in the mixture.

Any channel with insular relief on one or more walls may be used to receive the flow. For example, one or more positive or negative relief features are formed on ceiling or floor or both of the channel for each of one or more one-dimensional or two-dimensional arrays of particles. The insular relief features are formed on portions of the one or more walls where at least one wall, e.g., the ceiling, will deflect in response to a threshold pressure an amount that exceeds the height of the relief feature so that an engaged structure can be released. Thus one or more walls at the location of the relief elastically deflect sufficiently under pressures above a threshold pressure to release a hydrogel particle polymerized at the location.

In step 405, the flow is stopped, e.g., by closing the three-way valve 150, to prevent polymerized material from smearing in the direction of flow. In some embodiments, in which such smearing is negligible or desirable, step 405 is omitted.

In step 407, the mixture is subjected to polymerizing stimulation in the next 2D shape. If there is no previous 2D shape, then the next shape refers to an initial 2D shape. For example, the mixture is illuminated with illumination shaped with a 2D mask.

In step 409, it is determined whether there is another component to add to the particle, e.g., another supplemental structure to link to the already formed structure or structures. If so, control passes back to step 403 to flow the corresponding next pre-polymer mixture for the next component into the channel.

If there is no other supplemental structure to be added to the particle, then in step 411, the pressure in the channel is increased above a threshold deflection pressure. The threshold deflection pressure is a pressure above which at last one portion of the wall is deflected enough to release a particle engaged with a feature of the vertical relief. In a preferred embodiment, the threshold deflection pressure is a pressure above which at last one portion of the wall is deflected enough to release all particles engaged with all features of the vertical relief.

In step 413, the particles in the channel are flushed into a particle collection reservoir. For example, after all the particles have moved beyond the relief location, at least a slight pressure is maintained, which is sufficient to move the synthesized particles through the channel. The pressure is maintained for a time sufficient for the synthesized particles to leave the channel and enter the particle collection reservoir.

Particles

Figure 5:
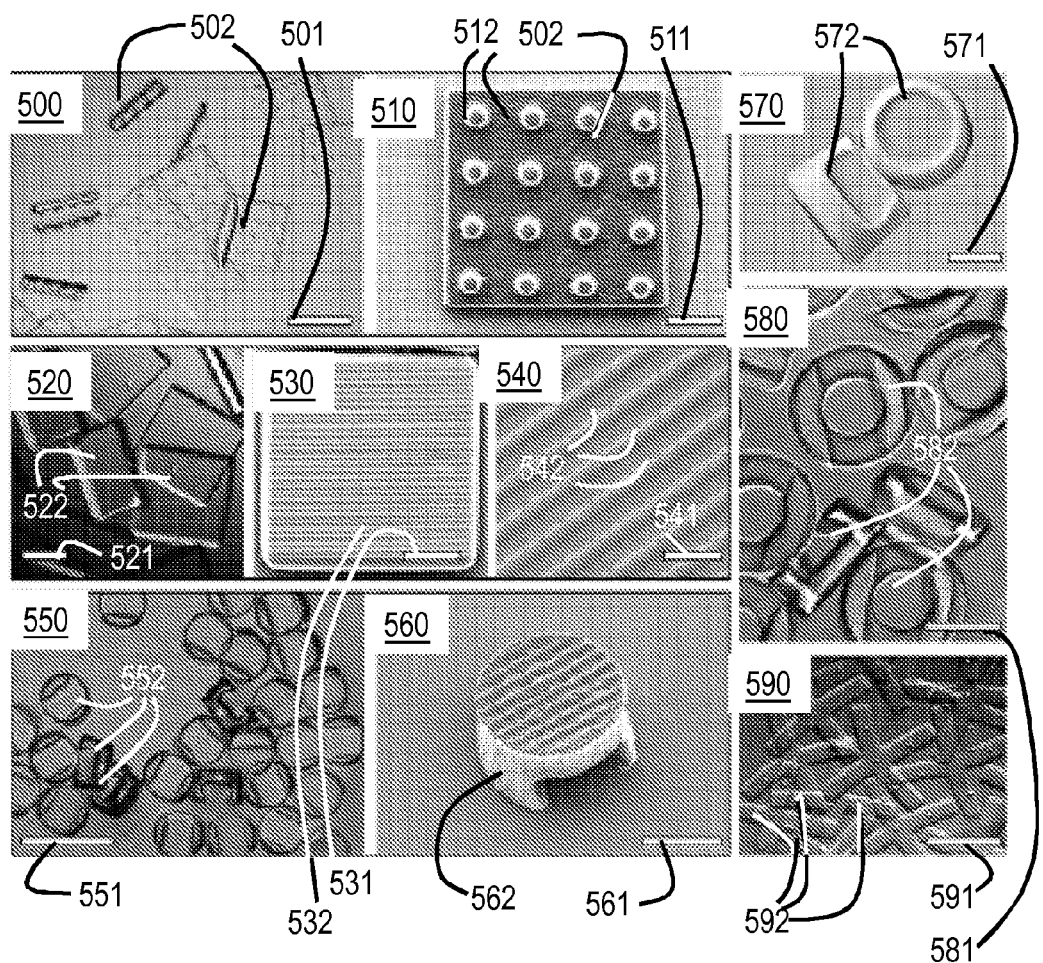
FIG. 5 is a collage of micrograph images that illustrate hydrogel microparticles with 3D shape, according to various embodiments.

A variety of 3D particles were synthesized with unique mask shapes and channel topographies. FIG. 5 is a collage of micrograph images that illustrate hydrogel microparticles with 3D shape, according to various embodiments. DIC image 500 (with scale bar 501 representing 200 microns) and scanning electron micrograph (SEM) image 510 (with scale bar 511 representing 50 microns) depict square particles 502 in side and plan view with 10 micron high pillars 512. These particles were fabricated using a 20 micron high channel with a 10 micron negative dot pattern on its ceiling in the relief location and a square photo mask during polymerization.

DIC image 520 (with scale bar 521 representing 100 microns) and SEM images 530 (with scale bar 531 representing 50 microns) and 540 (with scale bar 541 representing 10 microns) depict square particles 522 with 1 micron high line-space patterns 532 having individual ridges 542 about 3.5 microns wide and spaced apart about 3.5 microns for a 7 micron cycle distance (pitch). These particles were synthesized using a 30 micron high channel with negative line-space patterns on its floor in the relief location and a square photo-mask during polymerization. The very fine 3.5 micron line-space patterns (with 7 micron pitch) demonstrate the capacity of the method to produce particles with precisely defined linear features. These troughs could be oriented with the particle edges or made to be oblique by simply rotating the square mask with respect to the channel.

DIC image 550 (with scale bar 551 representing 100 microns) and SEM image 560 (with scale bar 561 representing 50 microns) depict table-like 3D particles with 1 micron high line-space patterns on the top and 30 micron high supports on the bottom. These particles were fabricated using a 30 micron high channel with one micron negative line-patterns on the ceiling and two 30 micron deep negative lines on the floor in the relief location and a round photo-mask during polymerization. These particles could not be made by rails, because the orientation of the supports on the bottom is perpendicular to the orientation of the lines on the top. These particles demonstrate that both channel floor and ceiling topographies could be used to dictate morphology. These table-like structures also show large relief support features on one side and a highly resolved 5 micron line-space pattern on the other, demonstrating the ability to combine coarse and fine features into particle topography.

SEM image 570 (with scale bar 571 representing 50 microns) depicts micro-cups with 30 micron deep voids. These particles were fabricated using a 60 micron high channel with a positive dot pattern on its ceiling, one dot for each particle, in the relief location. A round photo mask was used for each particle during polymerization. Such positive relief topographies can be used to generate dishes and cups—particles with voids that could be filled with active components or cells.

DIC images 580 (with scale bar 581 representing 100 microns) and 590 (with scale bar 591 representing 200 microns) depict variants using the 30 micron high channels with the same kinds of topographies of negative line-space and dots on their ceiling in the relief location, but different ring and cross masks during polymerization.

Morphologies generated with LRL can be even more complex, depending on the mold used to generate the channel relief features, and the mask used to polymerize the structures. Molds generated using standard lithography can be multi-tiered, rounded, or slanted. Virtually any channel topography, i.e., relief, can be achieved using multi-photon fabrication. The transparency masks used to generate particles can have virtually any two-dimensional shape, can be grayscale to provide variability in height along particles, and can be used in conjugation with interference masks to give finely tuned micro-porous structures.

An advantageous feature of LRL is that the release time is controllable. Because particle release occurs at a threshold pressure (related to deformation), pressures below threshold can be used, in various embodiments, to exchange the monomer or other component of a pre-polymer mixture without releasing the particles. This allows the subsequent addition of new chemistries in the same or supplemental structures. As such, LRL can be used efficiently to generate composite particles with multiple precisely positioned chemistries.

As shown in FIG. 3A, a multi-inlet channel is filled with pre-polymer mixture expressing chemistry #1 and a locked 3D structure 332 is polymerized. Then, by adjusting the pressures of the inlet streams (but keeping the inlet pressures below about 1 psi, well below the threshold pressure of 5 psi), a second pre-polymer mixture expressing chemistry #2 replaces the first pre-polymer mixture without displacing the locked particle structure 332. A unique mask is used with the second pre-polymer mixture expressing chemistry #2 to polymerize a supplemental structure 334 with chemistry #2 that is covalently linked to the locked structure 332 via overlap. Finally, a high pressure flow (e.g., about 10 psi) above the threshold pressure (e.g., about 5 psi) is used to release the composite particle 330.

Figure 6A:
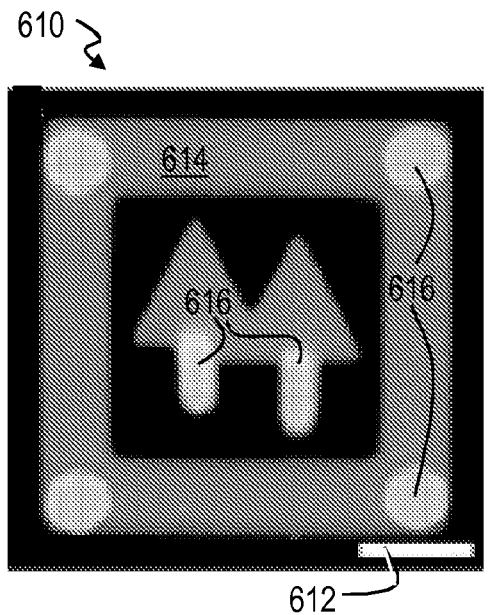
FIG. 6A, FIG. 6B and FIG. 6C are fluorescent micrograph images that illustrate hydrogel microparticles with 3D shape and multiple non-parallel patterned chemistries, according to various embodiments.
Figure 6B:
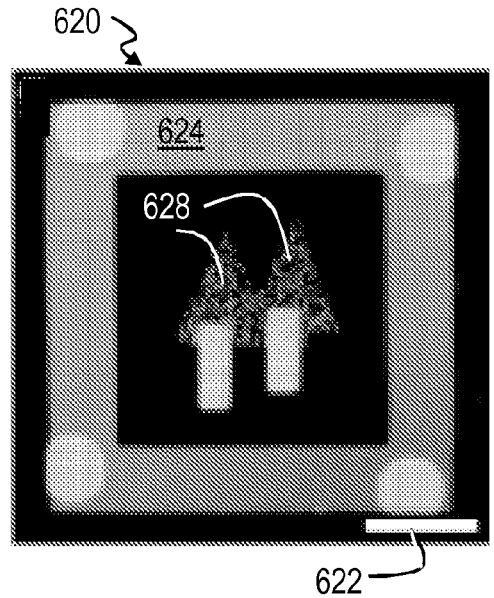
Figure 6C:
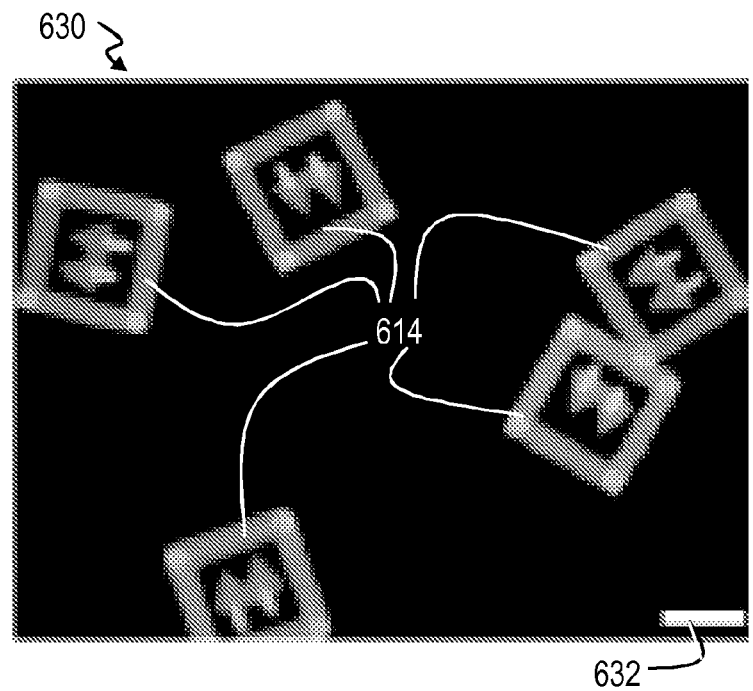

FIG. 6A, FIG. 6B and FIG. 6C are fluorescent micrograph images 610, 620, 630, respectively, that illustrate hydrogel microparticles with 3D shape and multiple non-parallel patterned chemistries, according to various embodiments.

To demonstrate the synthesis of composite particles with two chemistries, two different pre-polymer mixtures were used, both with poly(ethylene glycol) diacrylate (PEG-DA) monomer and one with a fluorescent monomer (rhodamine-acrylate, orange) to easily distinguish the chemistries via fluorescence after polymerization. Negative-relief locks were used to synthesize intricate particles with interior features and borders. FIG. 6A with scale bar 612 representing 50 microns, depicts a particle 614 comprising a first chemistry (without fluorescent monomer) in a dark structure and a second chemistry in a light structure due to fluorescence. The second chemistry forms a pattern that simulates two trees with triangular foliage in a frame, called "autumn trees" herein for convenience, because the fluorescence appear orange in color renderings. The six locks at the four corners of the frame and the two tree trunks appear brighter than the rest of the fluorescent region since they are thicker by virtue of the negative relief. In this embodiment there are no locks in the black structure. Thus, the black structure is polymerized after the locked fluorescent structure, so that the locked fluorescent structure can hold the linked black structure in place. FIG. 6C with scale bar 632 representing 100 microns, depicts five particles 614.

In other embodiments, similar approaches are applied to any number of unique chemistries. Shown in FIG. 6B with scale bar 622 representing 50 microns is particle 624 formed by applying three chemistries. The third pre-polymer mixture to represent chemistry #3 includes green fluorescent beads evident at light spots 628 in fluorescent micrograph 620 of FIG. 6B. The particles were synthesized using the third pre-polymer mixture of PEG-DA monomer stream with 500 nm wavelength (green) fluorescent beads. In this case, the sequence of polymerization is PEG-DA with fluorescent rhodamine-acrylate, then PEG-DA with fluorescent beads, and lastly PEG-DA with no fluorescent entities. The mask for this last chemistry caused partial overlap with the whole particle to covalently bind to the first formed structures. This particle 624 is called "spring trees" herein for convenience, because the fluorescence beads polymerized in the triangular foliage appear green in color renderings.

Due to lag times associated with fluidic exchange and mask alignment, the throughput for composite particles depends on how many different pre-polymer mixtures with corresponding different chemistries are applied. As the number of different chemistries incorporated into a particle increases, the throughput decreases. When two chemistries are used, about a thousand composite particles with dimensions of 50 microns were generated per hour. This can be expedited using dynamic mask systems known to those skilled in the art.

The overlap regions of multifunctional particles can be designed to provide interwoven chemistries or excluded chemistries, depending on the pore size of the initial material and the size of entities included in subsequent pre-polymer mixtures. When the pore size is large enough for molecules of a pre-polymer mixture to leech in, the result is an interwoven blend of the two or more chemistries. However, when one or more entities included in the later pre-polymer mixture are larger than the pore size of the existing structure, those entities are excluded from the overlap region, resulting in a segregation of chemistries. Examples of interwoven and excluded chemistries are shown in FIG. 7A.

FIG. 7A through FIG. 7F are composite micrograph images that illustrate hydrogel microparticles with 3D shape and multiple non-parallel patterned chemistries, according to various other embodiments.

Figure 7A:
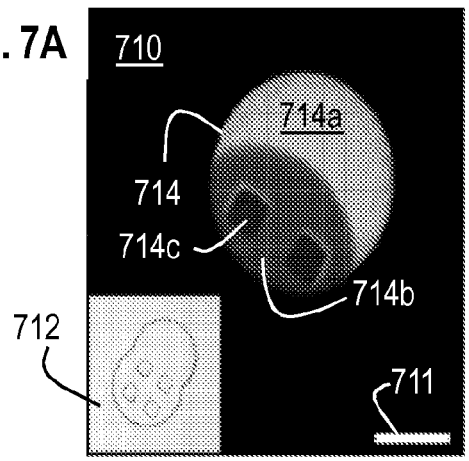
FIG. 7A through FIG. 7F are composite micrograph images that illustrate hydrogel microparticles with 3D shape and multiple non-parallel patterned chemistries, according to various other embodiments.

FIG. 7A includes fluorescent micrograph 710 with scale bar 711 representing 50 microns, and DIC inset 712, outlined for clarity, of a Venn diagram particle fabricated as two overlapping structures, using offset circular masks during polymerization. The first circular structure includes four positive relief locks and the second has just two of the positive relief locks. The first chemistry was a pure PEG hydrogel with a pore size expected to be about 1 nm. Because the first chemistry includes no fluorescent ingredient, the first structure is dark in image 710.

The second chemistry was PEG with the addition of rhodamine-acrylate and 50 nm beads that fluoresce in the green portion of the optical spectrum. The second structure 714, has a non-overlapping portion 714a expressing both orange and green fluorescence, and an overlapping portion 714b expressing only the orange fluorescence, including less fluorescence at spots 714c where the positive relief causes the particle to be thinner and fluoresce less. As can be seen, the fluorescent monomer penetrated the initial gel structure and was incorporated in the overlap region while the colloidal beads were excluded. The green beads are examples of excluded chemistries during polymerization of the overlap region.

Figure 7B:
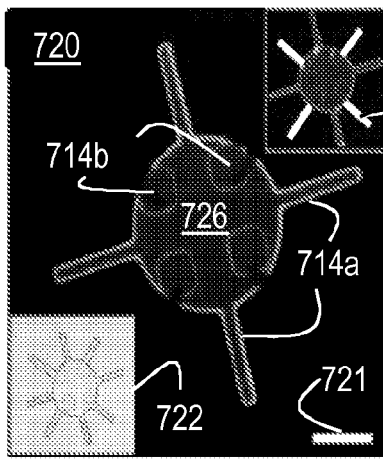

The ability to spatially arrange multiple chemistries in LRL was exploited to prepare particles with diverse functionalities. FIG. 7B includes fluorescent micrograph 720 with scale bar 721 representing 50 microns, and DIC inset 722, outlined for clarity. FIG. 7B also includes inset 723. DIC inset 722 shows a DNA detector particle with eight distinct probe regions. The interior region and four wings were synthesized with a first chemistry that included DNA probe #1, while the other four wings were synthesize with a second chemistry that included DNA probe #2. The particles were incubated with target #1 (which was labeled with green fluorescence, FITC) or both targets (target #2 was labeled with red fluorescence, Cy3), at 10 nanoMoles (nM, 1 nM=$10^{-9}$ Moles) at 37° C. for 30 min. Fluorescent image 720 shows the particle 726 after incubation with target #1 (green) only. Only four wings are fluorescent, all green in color rendering. Inset 723 shows a similar particle after incubation with both targets #1 and #2. The green wings are dim and the red wings 7724 are highlighted to appear bright. The fluorescence images confirm that the target oligomers hybridize only with their complementary probe regions.

Figure 7C:
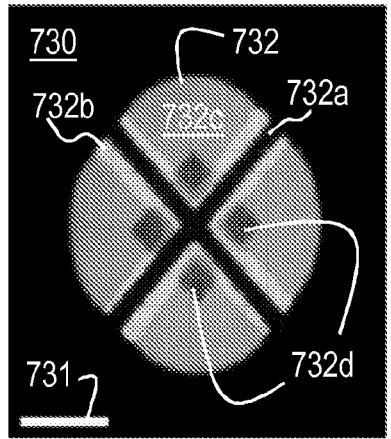

LRL was also used to generate particles with opposing chemistries—specifically particles with swelling and non-swelling structures. Swelling chemistries were achieved using PEG/acrylic acid monomer blends which are well-known to be responsive to changes in pH. For example, swelling portions of the 2D shapes were made using pre-polymer solutions of 15% (v/v) acrylic acid (POLY-SCIENCES), 15% (v/v) PEG-DA (700), 30% (v/v) poly (ethylene glycol)(200) (PEG, SIGMA ALDRICH), 5% (v/v) Darocur 1173 and 35% (v/v) 1×TE. A particular blend used in the example embodiment is described in more detail in a later section. Particles were fabricated with a cross-shaped support using one pre-polymer mixture, and pH-responsive, fluorescent fins using a different pre-polymer mixture between each arm of the cross. The fins were locked in place by four positive relief posts that thin the structure and decrease the fluorescence. FIG. 7C depicts a fluorescent micrograph 730 with scale bar 731 representing 100 microns, of the swelling fins particle 732. The particle includes a dark support structure 732a with no fluorescence. The fin structure 732c is formed around four positive relief locks that lead to spots 732d of less fluorescence. The fin structure 732c includes bright edges 732b indicating negative relief in the relief location of the channel ceiling where the particles are polymerized.

Figure 7D:
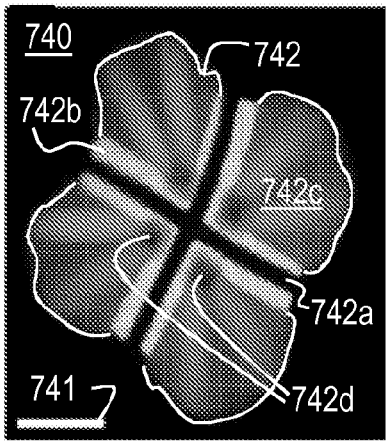
Figure 7E:
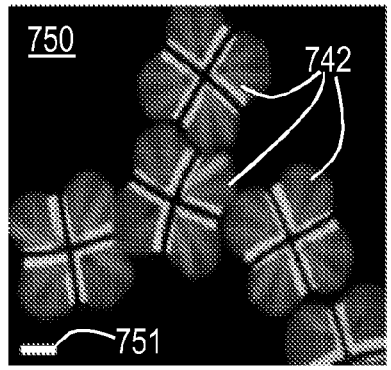

In acidic conditions (pH about 3), these particles keep their original, primarily 2D, shape as depicted in FIG. 7C. In neutral to alkaline conditions (pH about 8), the fins bloom to form a 3D flower-like structure as depicted in FIG. 7D and FIG. 7E. FIG. 7D depicts a fluorescent micrograph 740 with scale bar 741 representing 100 microns, of a particle 742 with swelling fins in neutral to alkaline conditions, fins outlined. The particle includes a dark support structure 742a with no fluorescence. The fin structure 742c includes spots 742d of less fluorescence and bright edges 742b as in particle 732. The swelling and bending of the fins is apparent from the outline of the fins structure 742c. FIG. 7E depicts a fluorescent micrograph 750 with scale bar 751 representing 100 microns, of several particles 742 with swelling fins in neutral to alkaline conditions.

Figure 7F:
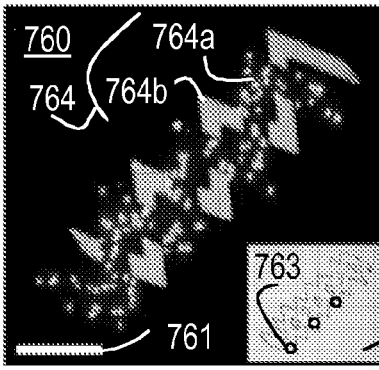

Particles with various encapsulated entities that are organized in complex hierarchies have also been synthesized. Particles with overlapping zig-zag-shaped chemistries were synthesized. FIG. 7F includes fluorescent micrograph 760 with scale bar 761 representing 100 microns, and DIC inset 762, outlined for clarity, of an overlapping zig-zag particle 764 fabricated as two overlapping structures, using offset zig-zag masks during separate polymerizations. Three positive relief posts 763 locking the first zig-zag polymerized are indicated by circles 763 imposed on the DIC inset. Chemistry of a first pre-polymer mixture included a pure PEG DA monomer with a pore size expected to be about 1 nm and 2 micron fluorescent beads (FITC, green) to form a first structure of the particle. Chemistry of a second pre-polymer mixture included a pure PEG DA monomer with a pore size expected to be about 1 nm and 5 nm fluorescent protein (streptavidin-phycorytherin, red) to form a second structure of the particle. The first chemistry is indicated in fluorescent micrograph 760 as bright dots 764a, where fluorescence from the distinct green beads is evident. The second chemistry is indicated in fluorescent micrograph 760 as bright areas 764b of fluorescence excluded from the first structure, that appear orange in color renderings.

This process can be used to encapsulate many different entities, including living cells, stimulating agents, organelles, one or more bioactive molecules such as therapeutic drugs, antibodies, receptors, proteins, nucleic acids, or nutrients, among others, with precise control over position. This precise positional control has implications for applications in tissue engineering. Compared to other hydrogel particle-based approaches to engineering tissue constructs, these techniques prepare more precise and intricate building blocks in a scalable and highly homogeneous manner.
Example Materials and Methods.

All of the particles shown in FIG. 2E, FIG. 5, and FIG. 6A through FIG. 6C were made using solutions of 5% by volume (v/v) DAROCUR 1173 (from SIGMA ALDRICH™ St. Louis, Mo.) as photo-initiator, 35% (v/v) 1X TE buffer and 60% (v/v) poly(ethylene glycol) (molecular weight 700) diacrylate (PEG-DA 700, from POLYSCIENCES INC.™ of Warrington, Pa.). TE is a common buffer solution that consists of Tris (pH buffer) and EDTA (chelating agent) and is often used to prevent the degradation of nucleic acids by limiting the efficacy of nucleases. 100× TE is obtained from EMD CHEMICALS INC.™ of San Diego, Calif. and then diluted to 1× with distilled water.

For particles depicted in FIG. 7B, twenty base pair oligonucleotide probes, #1 (5'-ATA GCA GAT CAG CAG CCA GA-3') and #2 (5'-CAC TAT GCG CAG GTT CTC AT-3') were purchased from INTEGRATED DNA TECHNOLOGIES, INC.™ of Coralville, Iowa with Acrydite modifications and mixed into the monomers for a final concentration of 50 micro-Moles (μM, 1 μM=10$^{-6}$ Moles). To distinguish between chemistries for multifunctional particles, 5% (v/v) food color was added into selected pre-polymer mixtures.

For particles depicted in FIG. 7C through FIG. 7E, pre-polymer mixtures for swelling fin structures included solutions of 15% (v/v) acrylic acid (from POLYSCIENCES INC.), 15% (v/v) PEG-DA (700), 30% (v/v) poly(ethylene glycol)(200) (PEG 200, from SIGMA ALDRICH), 5% (v/v) DAROCUR 1173 and 35% (v/v) 1× TE.

For structures depicted in FIG. 6C and FIG. 7F with encapsulated entities, the pre-polymer mixture included solutions comprising 30% (v/v) PEG-DA (700), 3.5% (v/v) DAROCUR 1173, 59.5% (v/v) 1× TE buffer, 5% (v/v) Tween 20 (SIGMA ALDRICH) with either: 2% (v/v) orange fluorescent protein (streptavidin-phycorytherin, from INVITROGEN™ of Carlsbad, Calif.); or 5% (v/v) 2 micron green fluorescent beads (FITC, from POLYSCIENCES INC.) in 5% (v/v) DAROCUR 1173, 30% (v/v) 1× TE buffer and 60% (v/v) PEG-DA.

Solutions, 0.01% wt, of the fluorescent methacryloxyethyl thiocarbamoyl rhodamine B (from POLYSCIENCES INC.) in PEG-DA were used to fluorescently label the hydrogel in FIG. 6A through FIG. 6C.

Microfludic devices were fabricated by pouring polydimethylsiloxane (PDMS, Sylgard 184, from DOW CORNING CORPORATION™ of Midland Mich.) on a silicon wafer containing positive-relief channels patterned in SU-8 photoresist (STANFORD MICROFLUIDICS FOUNDRY™ of Stanford, Calif.). The devices were 1,000 microns wide channels with varying heights (20, 30 or 60 microns) and various negative or positive relief (10 or 30 microns tall) on their ceilings. These devices were placed on PDMS-coated glass slides or plasma sealed to patterned PDMS surfaces after placing thin sacrificial layers of PDMS on the channel alone and on the region of the PDMS surfaces which sits right under the channel. Sacrificial layers ensure that the pre-polymer mixture or polymerized structure, e.g., the oligomer, was only exposed to the PDMS surfaces. The devices were mounted on an inverted microscope (Axiovert 200, CARL ZEISS MEDITEC, INC.™ of Dublin, Calif.). A reservoir was cut in the PDMS to collect the particles; and an inlet hole was punched in PDMS to supply pre-polymer mixture under pressure to the microfluidic device.

The formation of the microparticles was visualized using a charge-coupled-device (CCD) camera (KPM1A, from HITACHI AMERICA, LTD™ of Tarrytown, N.Y.). Images were captured and processed using National Institutes of Health (NIH) Image software or a digital camera (D200, from NIKON INC.™ Melville, N.Y.) and Nikon Capture software.

Pressure was provided by a compressed-air source to drive flow inside the microfluidic channels. To generate controlled pressure in the range of 0 to 15 psi, a compressed air source (about 40 psi) in the laboratory was first connected to either a T3510 I/P transducer (from MARSH BELLOFRAM™ Group of Companies of Newell, W.Va.) or a Type 100 LR manual pressure regulator (CONTROLAIR INC.™ of Amherst, N.H.). Downstream of the transducer/regulator, a 3-way solenoid valve (from BURKERT FLUID CONTROL SYSTEMS™ of Irvine, Calif.) was used to switch rapidly between atmospheric pressure (stop) and the input pressure (flow). The output from the 3-way valve was connected to the microfluidic device using Tygon tubing connected to a 10 milliliter (ml, 1 ml=10$^{-3}$ liters) pipette tip (from BioSciences from LIFESPAN™ of Seattle, Wash.)). The pipette tip was filled with the desired fluid and inserted into the inlet hole punched in the microfluidic device.

The transducer, 3-way valve and shutter were all controlled by a computer using scripts written in Labview 8.1 (NATIONAL INSTRUMENTS CORPORATION™ of Austin, Tex.). The 3-way valve was controlled using a 1024-HLS digital I/O board (MEASUREMENT COMPUTING CORPORATION™ of Norton, Mass.) and a relay to the computer. The transducer and the shutter were controlled using serial connections to the computer.

Photo-masks were designed in AUTOCAD 2005 and printed using a high-resolution printer at CAD ART SERVICES, INC.™ of Bandon, Oreg. The mask was then inserted into the field-stop of the microscope. A 100 Watt (W) HBO mercury lamp served as the source of UV light. A filter set that allowed wide UV excitation (11000v2: UV, from CHROMA TECHNOLOGY CORP™ of Rockingham Vt.) was used to select light of the desired wavelength and a VS25 shutter system (from UNIBLITZ™ of Vincent Associates of Rochester, N.Y.) driven by a computer-controlled VMM-D1 shutter driver provided specified pulses of UV light. Typical exposure times used were 30 to 100 ms; and pressures ranged from 0.05 to 15 psi.
Example Applications As shown above, lock-release polymerization, including LRL, can be used to rapidly generate various 3D and complex, composite particles with a broad range of potential parallel and non-parallel chemistries, interwoven or excluded, with incorporated entities including nucleic acids, proteins, living cells, quantum dots, beads and nanoparticles, among other species. The new hydrogel particles presented here surpass the limitations of existing colloidal materials used in a variety of industries. Among other uses, this technology may provide a powerful means to mass-produce functional units for microfluidic operations, filtration systems, and tissue engineering constructs. Furthermore, these 3D and composite particles promise distinct advantages as sorting media, smart materials and building blocks for self-assembled structures with complex functionality, impacting fields in drug delivery, composition manufacture, tissue engineering, optics and electro-mechanics. The new hydrogel particles can be used in drug delivery and diagnostic applications in the biomedical field. They can also be used to improve material properties of food, cosmetics, paints, and any other product which currently uses colloid technology. The colloids can also be used for basic research purposes to increase understanding of the role of mechanical properties in colloidal self-assembly and interactions, among other uses.

Extensions and Alternatives

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. An apparatus for synthesizing hydrogel particles comprising a body structure having formed therein a channel with insular relief in a top wall of the channel at a first location configured for particle synthesis, wherein the insular relief extends at most a first distance in a range from 1 to 250 microns perpendicular from a bottom surface of the top wall at the first location such that at least one wall of the top wall and bottom wall opposite the to wall at the first location is configured to deflect more than the first distance away from the opposite wall at applied pressures in a range from about 5 to about 15 pounds per square inch (psi).

2. An apparatus as recited in claim 1, wherein the channel is a microfluidic channel, and the hydrogel particle is a hydrogel microparticle.

3. An apparatus as recited in claim 2, wherein the first distance is about 30 microns, and the first pressures is about five pounds per square inch.

4. An apparatus as recited in claim 2, wherein the first distance is about 250 microns, and the first pressures is about five pounds per square inch.

5. An apparatus as recited in claim 1, wherein the body structure comprises polydimethylsiloxane (PDMS).

6. An apparatus as recited in claim 1, wherein a thickness of the top wall with the insular relief is about 200 microns and a width of the wall of the channel is about 1000 microns.

7. An apparatus as recited in claim 1, wherein the first distance is in a range from about 10 microns to about 30 microns.

* * * * *